(12) United States Patent
Katsuyama

(10) Patent No.: US 8,227,275 B2
(45) Date of Patent: Jul. 24, 2012

(54) METHOD TO FORM SEMICONDUCTOR LASER DIODE WITH MESA STRUCTURE BURIED BY CURRENT BLOCKING LAYER

(75) Inventor: Tomokazu Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 260 days.

(21) Appl. No.: 12/692,177

(22) Filed: Jan. 22, 2010

(65) Prior Publication Data

US 2010/0190283 A1 Jul. 29, 2010

(30) Foreign Application Priority Data

Jan. 26, 2009 (JP) ................... 2009-014319

(51) Int. Cl.
*H01L 27/15* (2006.01)
*H01L 33/00* (2010.01)
*H01S 3/16* (2006.01)
(52) U.S. Cl. .......... 438/31; 438/47; 372/50.11; 372/102
(58) Field of Classification Search .................. None
See application file for complete search history.

(56) References Cited

U.S. PATENT DOCUMENTS

| 5,822,349 A | 10/1998 | Takaoka et al. |
| 6,461,969 B1 | 10/2002 | Lee et al. |
| 2007/0253456 A1* | 11/2007 | Yagi .......................... 372/45.012 |
| 2008/0290358 A1* | 11/2008 | Hiratsuka ........................ 257/98 |
| 2010/0190283 A1 | 7/2010 | Katsuyama |

FOREIGN PATENT DOCUMENTS

| JP | 8-250808 | 9/1996 |
| JP | 10-256669 | 9/1998 |

* cited by examiner

*Primary Examiner* — Zandra Smith
*Assistant Examiner* — Pamela E Perkins
(74) *Attorney, Agent, or Firm* — Smith, Gambrell & Russell, LLP

(57) ABSTRACT

A method to form a an LD with the buried mesa type is disclosed, in which the n-type current blocking layer is stably kept with a distance to the active layer in the buried mesa. The method of the invention includes a step to form the mesa by iterating the RIE and the ashing to obtain in a mesa side a steep edge with the (110) surface. A wet-etching process subsequent to the iterative etching and ashing removes residuals left on the mesa side. Then, the growth of the current blocking layer shows two modes of the horizontal growth of the (110) surface and the vertical growth of the (001) surface comparably.

8 Claims, 6 Drawing Sheets

METHOD TO FORM SEMICONDUCTOR LASER DIODE WITH MESA STRUCTURE BURIED BY CURRENT BLOCKING LAYER

BACKGROUND OF THE INVENTION

1. Field of the Invention

The present invention relates to a method to from a semiconductor laser diode (hereafter denoted as LD), in particular, the invention relates to a process of the LD with a mesa structure buried by a current blocking layer with a reversely biased junction.

2. Related Prior Art

One type of an LD called as the buried hetero-structure has been well known in the fields. For instance, as disclosed in Japanese Patent Application published as JP-H08-250808A, the LD with the buried hetero-structure has an arrangement to confine the carriers by burying the mesa including an active layer and having a width of about 1 μm by the current blocking layer in both sides of the mesa.

FIG. 6 shows a cross section of the LD 200 buried with the blocking layers with a pn-junction. This LD 200 provides, on the n-type InP substrate 201, the mesa structure including the n-type InP buffer layer 202, the InGaAsP active layer 203, and the p-type InP cladding layer 204. Both sides of the mesa structure are provided with the p-type InP layer 205, the n-type InP blocking layer 206, and the p-type InP blocking layer 207. The LD 200 further provides, on the mesa and the blocking layer 207, the second p-type InP cladding layer 208, the p-type InGaAs contact layer 209, and two electrodes with the p-type 201 and the n-type 211. The LD 200 blocks the carriers injected from both electrodes, 210 and 211, by the p-type InP burying layer 205, the n-type InP blocking layer and the p-type InP blocking layer 207, which realizes the current confinement structure.

When the mesa is formed by, for instance, the wet-etching, the shape, in particular, the cross section thereof is likely deformed, which influences the distance between the active layer 203 in the mesa and the n-type InP blocking layer 206. A closer n-type InP blocking layer 206 to the n-type InP buffer layer 202 means that the carriers may easily tunnel the p-type InP burying layer 205; while, a thicker p-type InP burying layer 205 means that the holes may easily detour the active layer 203; both of which increases the leak current and degrades the emission efficiency. In order to reduce the effect described above, it is essential to reduce the scattering of the distance 200D illustrated in FIG. 6; but no substantial techniques has been known to make the distance 200D constant.

SUMMARY OF THE INVENTION

The manufacturing process for an LD includes steps of:
(a) growing a stack of semiconductor layers on a semiconductor substrate with a surface orientation substantially equal to (001);
(b) iterating a step of dry-etching of the stack and a step of ashing, wherein the dry-etching of the stack is carried out by using an insulating stripe extending along <110> orientation to form a mesa structure that has a side surface with an angle from 85° to 95° to the surface of the semiconductor substrate, and the ashing removes residues caused in the step of dry-etching;
(c) growing a first current blocking layer on both sides of the mesa structure so as to bury the mesa structure; and
(d) growing a second current blocking layer on both sides of the mesa structure so as to bury the mesa structure.

The process according to the present has a feature that the first current blocking layer first grows along both orientations of <110> on the side surface of the mesa structure and <001> on the surface of the stack exposed by the dry-etching, and the second current blocking layer first grows along both orientations of <110> and <001> on the first current blocking layer but secondly grows along orientations of <111> and <110>.

The iteration of the step of dry-etching and the step of ashing may make an angel of the side surface of the mesa structure to the surface of the substrate from 85° to 95°, which may explicitly show the surface orientation of (110) in the side surface of the mesa structure. Because the first current blocking layer may stably grow along <110> orientation on the side surface of the mesa structure, a distance from the mesa structure to the second current blocking layer grown on the first current blocking layer may be secured.

BRIEF DESCRIPTION OF DRAWINGS

The invention may be more clearly understood in consideration of the following detailed description of various embodiments of the invention in connection with the accompanying drawings, in which.

DESCRIPTION OF PREFERRED EMBODIMENTS

Figure 1A:
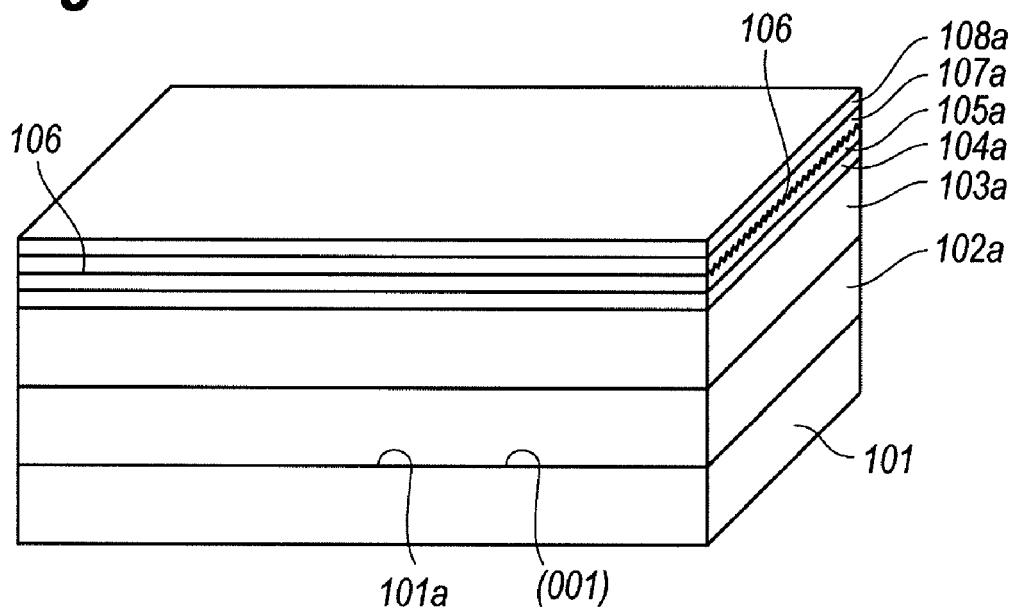
FIG. 1A shows a process to stack semiconductor layers on the semiconductor substrate.

Next, preferred embodiments according to the present invention will be described as referring to accompanying drawings. In the description of the drawings, the same numerals or symbols will refer to the same elements without overlapping explanations.

A process to form the LD 100 according to an embodiment of the present invention will be described as referring to FIGS. 1 to 4, which show steps of the manufacturing process of the LD 100. Semiconductor layers included within the LD 100 may be obtained by a technique of the metal organic vapor phase epitaxy (MOVPE) using tri-methyl-gallium (TMGa), tri-methyl-indium (TMIn), phosphine (PH$_3$) and arsine (AsH$_3$) as source materials for elements of gallium (Ga), indium (In), phosphorus (P) and arsenic (As), respectively. Diethyl-zinc (DEZn) and mono-silane (SiH$_4$) may be source materials for the p-type and n-type dopants, respectively.

(Layer Stacking Process)

First, a plurality of semiconductor layers, 102a to 105a, involving a layer 104a for the active layer 104, are grown on a primary surface 101a of the semiconductor substrate 101. The primary surface 101a has the (001) orientation or substantially equal to the (001) orientation, which means that the primary surface 101a has the surface offset from the (001) orientation within 2 degrees. The process to grow the semiconductor layers includes a growth of a layer 102a for the buffer layer 102 on the whole surface of the primary surface 101a, a layer 103a for the first confinement layer 103, a layer 104a for the active layer, and a layer 105a for the second confinement layer, in this order by using the MOVPE technique.

The layer 102a is made of InP with a thickness of 550 nm and doped with Si. The carrier concentration of this layer 102a is $1.1 \times 10^{18}$ cm$^{-3}$ in the present embodiment. The layers, 103a and 105a, for the optical confinement are made of GaInAsP with a band gap wavelength of 1150 nm and a thickness of 100 nm.

The layer 104a for the active layer is made of GaInAsP with a multiple quantum well structure (hereafter denoted as MQW structure). Although not explicitly described in figures, the MQW structure of this layer 104a provides 8 well layers and 9 barrier layers alternately stacked each other. The barrier layers has a band gap wavelength of 1200 nm, while, the well layers has a band gap wavelength of 1550 nm in the present embodiment, which leaves the lattice mismatching of about 1.0% in the active layer 104. Each barrier layers has a thickness of 10 nm, while, each well layers has a thickness of 5 nm.

Subsequent to the growth of the layers, 102a to 105a, the process further grows a periodic structure 106 for the diffraction grating on the layer 105a for the second confinement layer 105. Furthermore, the process forms, on the periodic structure 106, a layer 107a for the p-type cladding layer 107 made of InP with a thickness of 200 nm and doped with Zn. Thus, the periodic structure 106 combined with the layer 107a may form the diffraction grating. The period of the grating is 242 nm, while, the carrier concentration of the layer 107a for the p-type cladding layer 107 may be $6.5 \times 10^{17}$ cm$^{-3}$. On the layer 107a is grown with a layer 108a for the cap layer 108. The layer 108a is made of InGaAs with a thickness of 200 nm and doped with Zn. This layer 108a may have a carrier concentration of $2.0 \times 10^{17}$ cm$^{-3}$.

(Mesa Forming Process)

Figure 1B:
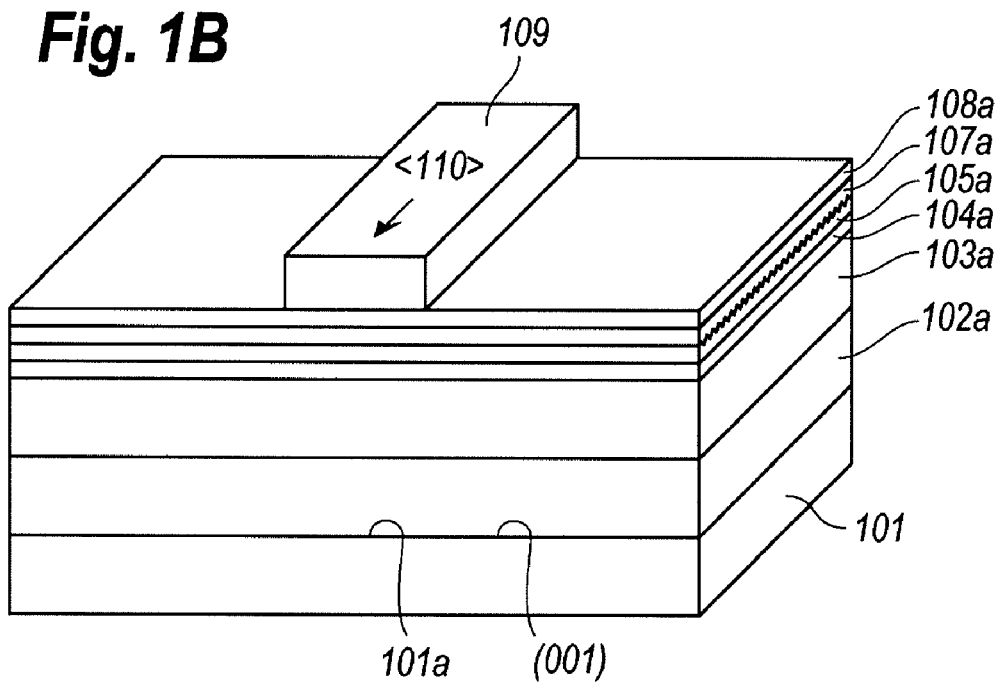
FIG. 1B shows a process to prepare the insulating mask on the stacked semiconductor layer.

Subsequently, as illustrated in FIG. 1B, the process forms a striped mask 109 on the layer 108a for the cap layer 108, where the mask 109 is made of insulating material and extends along the <110> orientation. The insulating mask 109 is preferably thicker than 0.5 μm and less than 2.0 μm, and may be made of silicon die-oxide ($SiO_2$) which is formed by a conventional chemical vapor deposition (CVD) technique using tetra-ethyl-ortho-silicate (TEOS) as a source material. A conventional lithography may form the stripe pattern of the insulating mask 109.

(Mesa Etching Process)

Figure 2A:
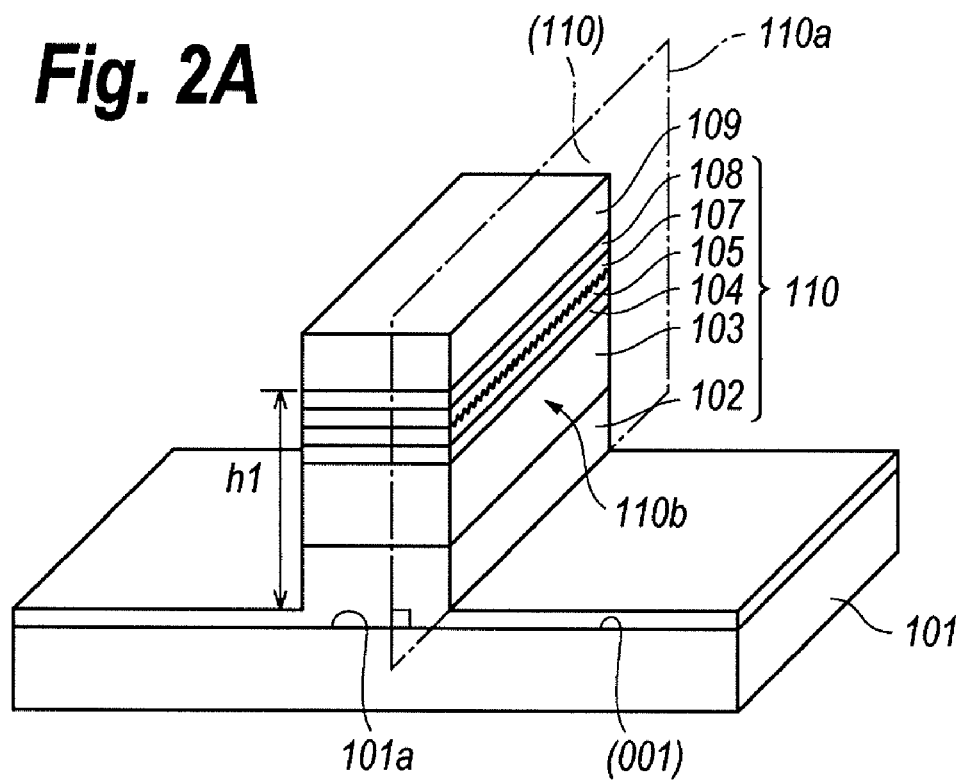
FIG. 2A shows a process to form the mesa by the dry-etching as using the insulating mask as an etching mask.

Next, as illustrated in FIG. 2A, the process forms a mesa 110 by etching the layers, 102a to 108a, using the insulating layer 109 as the etching mask. In this process, the mesa 110 shows a side surface 110b with an angle of 85° to 95°, preferably, a right angle 90° with respect to the primary surface 101a of the substrate 101. The side surface 110b extends along a virtual plane 110a shown in FIG. 2A. The etching of the layers 102a to 108a is carried out by the dry-etching of, what is called, the reactive ion-etching (RIE). The RIE is one of the suitable processes to obtain a steep edge in the mesa side 110b with a (110) orientation and makes an angle 85° to 95° to the primary surface 101a that has an (001) orientation.

The side 110b of the mesa 110 after the dry-etching is generally covered with residues deposited during the etching, which is not explicitly illustrated in the figure. Accordingly, an ashing process not only after the dry-etching but during the etching is necessary to remove the residues. In the present embodiment, the process may form a semiconductor mesa 110 with the steep side surface 110b as shown in FIG. 2A by iterating the dry-etching and the ashing. The mesa 110 includes the buffer layer 102, the first confinement layer 103, the active layer 104, the second confinement layer 105, the p-type cladding layer 107, and the cap layer 108. The mesa 110 may have a height, in the preset embodiment, greater than 2.4 μm. The function of the mesa, particularly, the height thereof will be described later. Table I shown below lists typical conditions of the dry-etching and that of the ashing. The present embodiment iterates the etching and the ashing about 50 times and these two processes are carried out in the same reaction chamber of the ICP-RIE (Induction Coupled Plasma enhanced Reactive Ion Etching) apparatus only by changing the gas sources and the electrical powers for the RF signal and the bias without exposing the device under the process in the air.

TABLE I

Typical conditions of etching and ashing

| Etching | |
|---|---|
| gas source | mixture of methane ($CH_4$) and hydrogen ($H_2$) |
| flow rate | $CH_4$: 25 sccm, $H_2$: 25 sccm |
| pressure | 1.5 Pa |
| RF power | 100 W |
| bias power | 30 W |
| Rate | ~1.8 μm/h |
| time | 180 sec/cycle |
| Ashing | |
| gas source | oxygen ($O_2$) |
| flow rate | 80 sccm |
| pressure | 1.5 Pa |
| RF power | 300 W |
| bias power | 15 W |
| time | 105 sec/cycle |

Subsequent to the iterating process of the etching and the ashing, the residues still remained in the side surface 110b of the mesa 110 may be removed by a sequential treatment of sulfuric acid and fluoric acid. The sulfuric acid removes carbon based residues which are primarily derived from methane ($CH_4$) used in the dry-etching, while, the fluoric acid may remove silicon based residues which is primarily due to the dissociation of the $SiO_2$ in the mask 109. It is well known that the dry-etching causes damages or alterations in a surface of the etched material. Accordingly, the present process carries out, after the sequential etching described above, a further wet-etching by bromine methanol to remove such a damaged and altered surface layer. The etching by the bromine methanol may etch by about 50 nm of the surface. Table II below lists the conditions of those wet-etchings:

TABLE II wet-etching conditions

| sulfuric etching | |
|---|---|
| solution | undiluted solution (2 normal) |
| time | 2 minutes |
| temperature | room temperature |

TABLE II-continued wet-etching conditions fluoric etching

| | |
|---|---|
| solution | HF:H$_2$O = 1:20 |
| time | 15 sec. |
| temperature | room temperature |

Br-Methanol etching

| | |
|---|---|
| solution | Br$_2$:CH$_3$OH = 0.5:800 |
| time | 30 sec. |
| temperature | 0° C. |

The sequential wet-etching described above may enhance the wettability of the side surface 110b of the mesa 110, which increases the quality of the initially grown crystal on the side surface 110b and the surface of the etched layer 102 so as to show the orientations of (111), (110) and (001) clearly. Without the subsequent wet-etchings or the wet-etching is insufficiently carried out, the residues and/or the damaged and altered layer left on the side surface 110b of the mesa 110 prevents a subsequent epitaxial growth to bury the mesa 110. Thus, the semiconductor layers grown under such conditions become ambiguous in orientations of (111), (110) and (001), respectively.

(Mesa Burying Process)

Figure 2B:
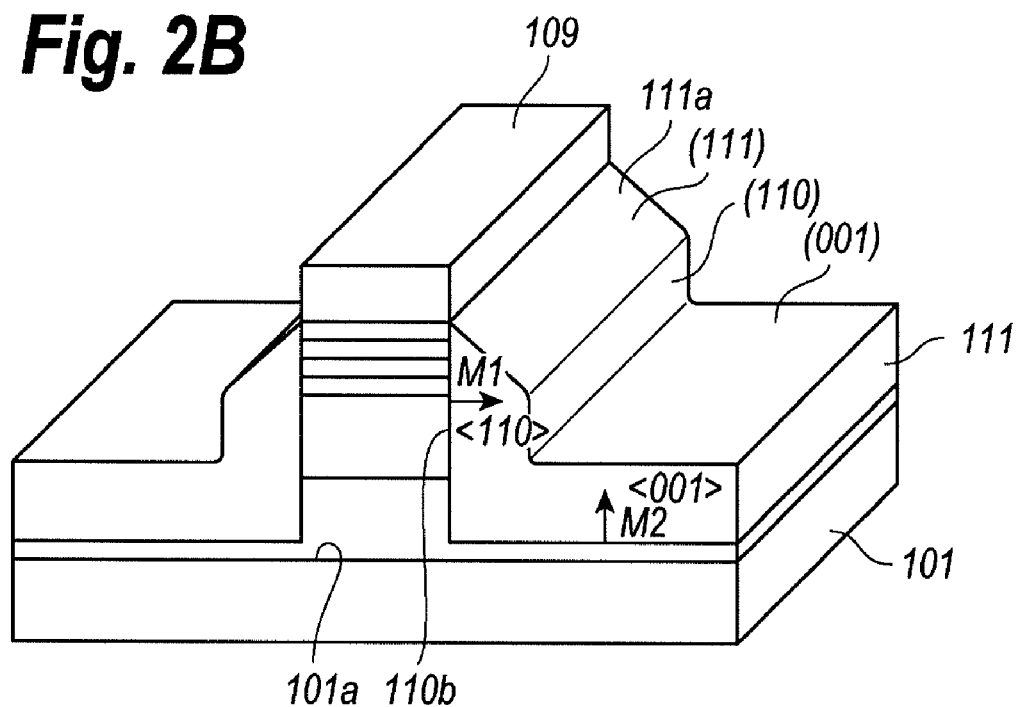
FIG. 2B shows a process to bury the mesa by the first blocking layer.

Next, as shown in FIG. 2B, the process buries the mesa 110 by growing a Zn-doped InP layer 111 for the p-type current blocking layer selectively in both sides of the mesa 110 by the insulating stripe 109 as the growing mask. This second growth includes two modes: the first mode is the horizontal growth of the layer 111 on the side 110b of the mesa 110 along the <110> orientation as maintaining the top 111a thereof in the (111) orientation of; while the second mode is the vertical growth of the layer 111 along the <001> orientation, which is in perpendicular to the primary surface 101a of the substrate 101. Symbol M1 appeared in FIG. 2B corresponds to the first mode, while, the other symbol M2 denotes the second mode. Further, the orientations, <110> and <001>, are also shown in FIG. 2B by respective arrows, and the top 111a of the Zn-doped InP layer 111 with the (001) orientation is also shown in FIG. 2B.

In the process to grow the current blocking layer so as to bury the mesa 110, source material supplied in a top region of the insulating mask 109 is not consumed for the growth because the mask 109 has a poly crystal or a non-crystal structure. Then, the source materials fall on both sides of the mesa 110, and primarily are consumed to grow the layer 111 along the <110> orientation because the mesa 110 formed in the former process shows the steep edge with the (110) orientation. Without the steep edge of the mesa as that formed through the conventional process, even the source materials supplied on the top of the mesa 110 and not consumed therein, flow on the side of the mesa 110, and are not used to grow the layer along the <110> orientation because the side of the mesa has obscure surface orientations. Because of the steep edge of the side 110b of the mesa so as to show the (110) orientation therein, the growth rate along the <110> orientation and that along the <001> orientation become substantially equal to each other in the present embodiment.

Thus, the first grown layer 111 may clearly show the surface orientations of (111), (110) and (001). This Zn-doped InP layer 111 is grown, as mentioned earlier, by the MOVPE technique, and the carrier concentration thereof is about 2.1×10$^{18}$ cm$^{-3}$. In a case where the growth rate along the <001> orientation and that along the <110> orientation are substantially equal to each other, a thickness of the Zn-doped InP layer along respective orientations becomes about 1.0 µm.

Figure 3A:
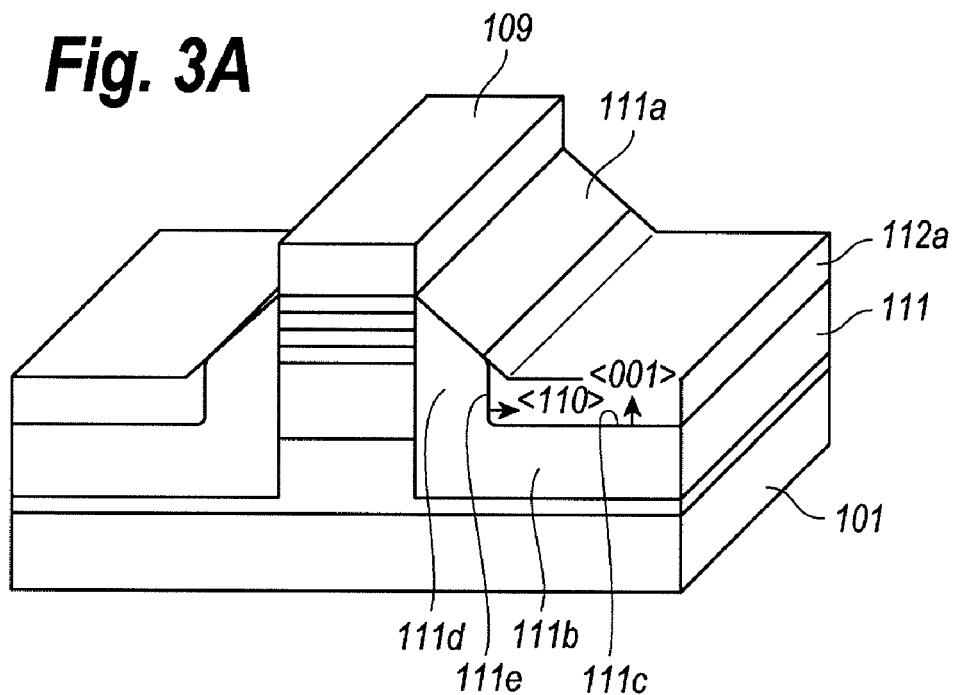
FIG. 3A shows a process to grow the first part of the second blocking layer.

Next, another burying layer made of InP doped with silicon (Si) is selectively grown so as to bury the mesa 110 by the insulating stripe 109 as the mask. This layer 112a is for the n-type current blocking layer 112. As illustrated in FIG. 3A, the present process for growing the Si-dope InP layer 112a also has two modes. That is, (1) along the <110> orientation on a surface 111e of the Zn-doped InP layer 111 that is grown along the <110> orientation according to the first mode in the previous process and denoted by the symbol 111d; and (2) along the <001> orientation on a surface 111c of the Zn-doped InP layer 111 that is grown along the orientation <001> according to the second mode in the previous process and denoted by the symbol 111b in FIG. 3A. Thus, the Si-doped InP layer 112a may become the second current blocking layer to bury the mesa 110. That is, the growth of the layer 112a fully reflects the surface orientations appeared in the layer 111.

The MOVPE technique which is already described may also grow the Si-doped InP layer 112a with a carrier concentration of about 2.0×10$^{18}$ cm$^{-3}$. The growth rate of the Si-doped InP layer 112a along the <001> orientation and that along the <110> orientation are substantially equal to each other because the source materials supplied on the top region of the insulating mask 109 still flow in both sides of the mesa 110 and used to grow the layer 112a of the first mode. Furthermore, the growth rates of the layers along the <001> and <110> orientations, respectively, become comparable to those of the Zn-doped InP layer 111 along the >001> and <110> orientations, respectively.

Figure 3B:
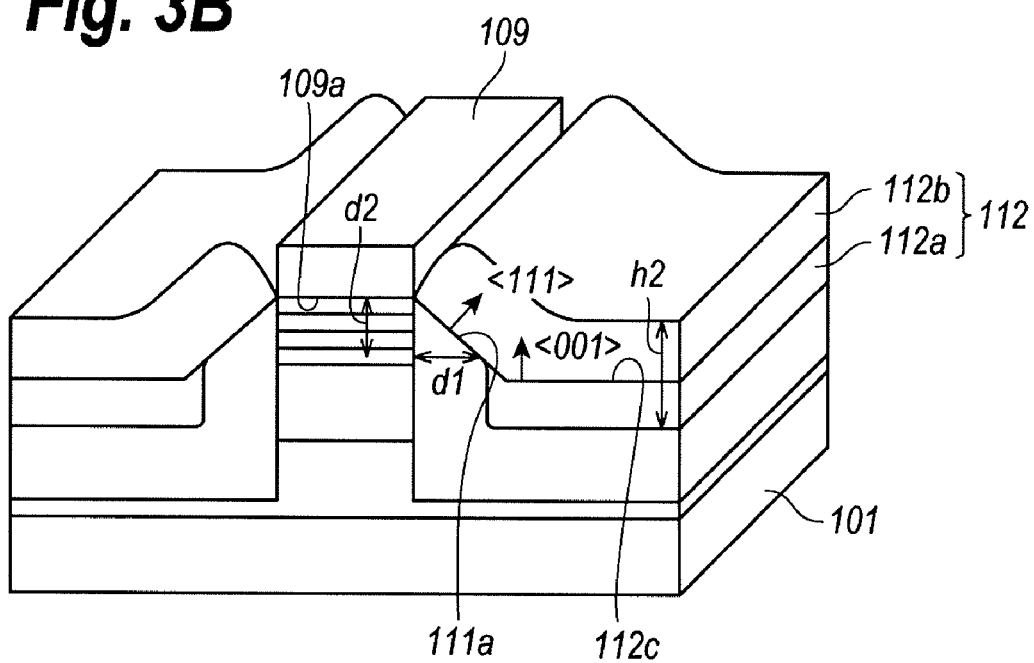
FIG. 3B shows a process to grow the second part of the second blocking layer.

Next, another Si-doped InP layer 112b is grown, as illustrated in FIG. 3B, on the surface 111c and the surface 111b of the previously grown Si-doped InP layer 112a. However, the surface 111b with the (110) orientation disappears during the growth of the layer 112b. Then, the source materials which is supplied on the top region of the insulating mask 109 and used to grow the layer along the <110> orientation is going to be used to grow the layer along the <111> orientation. Thus, the thickness of the layer 112b becomes substantially homogeneous to form bumps adjacent to the mesa 110.

The present embodiment clearly distinguishes two Si-doped InP layers, 112a and 112b, however, the practical process may successively grow two Si-doped layers under a same condition, whereby the n-type current blocking layer 112 may have a thickness h2 appeared in FIG. 3B of 1.2 µm. The growth rate of the second Si-doped InP layer 112b along the <001> orientation and that along the <111> orientation are often comparable; moreover, such a growth rate is sometimes substantially equal to the growth rate of the Zn-doped InP layer 111 along the <001> orientation and the <110> orientation. The second Si-doped InP layer 112b of the present embodiment may have a carrier concentration of 2.0×10$^{18}$ cm$^{-3}$.

Although not explicitly illustrated in the figures, another InP layer in addition to two InP layers, 111 and 112, may be formed as the current blocking layer. This additional InP layer may be disposed on the n-type current blocking layer 112 with a thickness of 0.1 µm and a carrier concentration of 1.2×10$^{19}$ cm$^{-3}$. This third current blocking layer may be made of Zn-doped InP layer.

(Cladding Layer Formation)

Figure 4A:
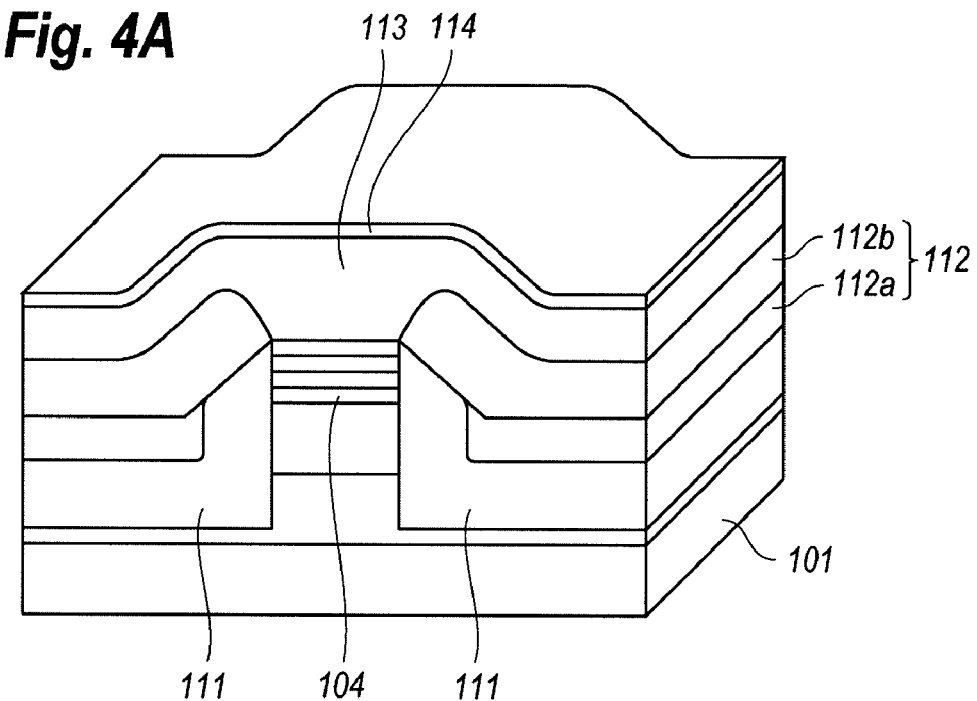
FIG. 4A shows a process to form the upper cladding layer and the contact layer on the mesa and the second current blocking layer.

Next, another semiconductor layer 113 for the p-type cladding layer is grown on the mesa 110 and also on the n-type current blocking layer 112 after removing the insulating mask 109 as illustrated in FIG. 4A. This p-type cladding layer 113 may be also grown by the MOVPE technique and made of Zn-doped InP with a thickness of about 1.6 μm and a carrier concentration of about 1.4×10¹⁸ cm⁻³. The fluoric acid may remove the insulating mask 109. On the p-type cladding layer 113 is grown with another semiconductor layer 114 for the contact layer. The MOVPE technique may be also applicable to the growth of the contact layer 114. The contact layer 114 may be made of Zn-doped InGaAs with a thickness of about 0.5 μm and a carrier concentration of about 1.5×10¹⁸ cm⁻³.

(Trench Formation)

Figure 4B:
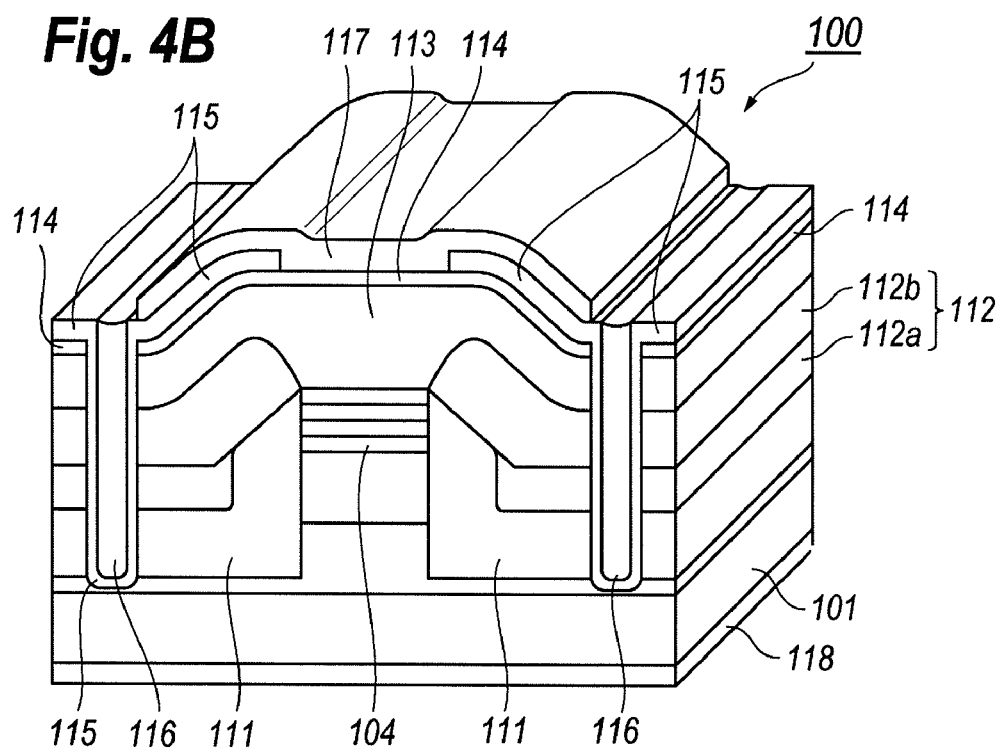
FIG. 4B shows a process to form the electrodes on the top and on the back surface of the substrate.

Next, two trenches 116 are formed in both sides of the buried mesa 110, as shown in FIG. 4B. The trenches 116 and the contact layer 114 are covered with an insulating film 115, which may be made of silicon die-oxide $SiO_2$. Then the trenches 116 are filled with benzo-cyclo-butene (BCB). The insulating film 115 is opened in a portion above the mesa 110 and the top electrode 117 made of eutectic metal of AuGe is deposited so as to come in contact with the contact layer 113, while the bottom electrode 118 made of another eutectic metal of AuZn is formed on the back surface of the substrate 101 to complete the LD 100.

The LD 100 thus formed, as illustrated in FIG. 4A, provides the substrate 101 made of n-type InP, the mesa 110, the p-type current blocking layer 111, the n-type current blocking layer 112, the p-type cladding layer 113 and the contact layer 114. The mesa 110, as shown in FIGS. 1A to 2A, includes a plurality of semiconductor layers, 102a to 108a, including the active layer 104a, and formed by the dry-etching using the insulating stripe 109 provided on the top of the mesa 110 as the etching mask. One feature of the present LD 100 is that the shape of the mesa 110, in particular, the side surface 110b of the mesa makes an angle from 85° to 95° against the primary surface 110a of the substrate 101.

The p-type current blocking layer 111 buries the mesa 110 and is made of Zn-doped InP. As illustrated in FIG. 2B, the p-type current blocking layer 111 has the (001) surface grown along the <001> orientation so as to continue from the primary surface 101a of the buffer layer 101, and also has the (110) surface grown along the <110> orientation so as to continue from the side surface 110b of the mesa 110.

The n-type current blocking layer 112 buries the mesa 110 and may be made of Si-doped InP. As illustrated in FIG. 3A, the n-type current blocking layer 112 first grows on the (001) surface of the p-type current blocking layer 111 along the <001> orientation and also on the (110) surface along the <110> orientation; next, on the surface (111) of the layer 111 along the <111> orientation as continuing the growth of the surface (001) along the <001> orientation because the (110) surface disappears during the growth of the second current blocking layer 112. A distance from the active layer 104 to the n-type current blocking layer 112, which corresponds to a distance d1 in FIG. 3B, is preferably greater than 50 nm and less than 400 nm after the growth of the n-type current blocking layer 112. In order to obtain such distance, a stack of the semiconductor layers, 104a to 108a, is preferably grown such that a distance from the bottom 109a of the insulating mask 109 to the center of the layer 104a for the active layer 104, which corresponds to a distance d2 in FIG. 3B, becomes greater than 71 nm and less than 566 nm. These numerals may be simply derived from the angles between the surfaces of the single crystal with the zinc blende structure in connection with the distance d1 from the mesa to the layer 112.

In the process to form the LD according to the present embodiment, the first growth to bury the mesa 110 has two modes; the first mode M1 growing the layer 111 along the <110> orientation and the second mode M2 growing the layer 111 along the <001> orientation. Further, the growth rate of theses two modes show substantially equal to each other because the source materials supplied on the top region of the insulating mask 109 flow in both side of the mesa 110 and are consumed to grow the layer 111 along the <110> orientation. Therefore, the thickness of the Zn-doped InP layer 111 along the <110> orientation, that is, the distance from the mesa 110 to the Si-doped InP layer 112 may be securely kept constant.

In the present embodiment according to the invention, the process may further provide a step to measure the growth rate in the first mode M1 to grow the first current blocking layer horizontally and that in the second mode M2 to grow the layer horizontally in advance of the practical growth of the layers; and the thickness x of the first current blocking layer preferably is thinner than a thickness derived from the following:

$$x = t_{mesa}/(1+1.43\alpha),$$

where $t_{mesa}$ is a height of the mesa 110 and α is a ratio of the growth rate of the first mode to that of the second mode.

To keep the distance from the active layer 104 to the n-type current blocking layer 12 in constant, the thickness of the p-type current blocking layer 111 is preferably thinner than the critical thickness given by the above equation. Measuring the growth rate in both modes and forming the mesa with a preset height $t_{mesa}$, the thickness of the p-type current blocking layer may be adjusted so as to be thinner than the critical thickness x determined by the above equation.

In another aspect, the mesa formed by the processes shown in FIGS. from 1A to 2A preferably has a thickness determined by the flowing equation:

$$t_{mesa} \geq (1+1.43 \times \alpha) \qquad (2)$$

where the height $t_{mesa}$ of the mesa corresponds to the height h1 shown in FIG. 2A, and the ratio α is preferably from 0.2 to 1.0. The p-type current blocking layer 111 is necessary to be thicker than 1 μm to show the function of the current blocking, then, the height $t_{mesa}$ of the mesa preferably becomes greater than (1+1.43α) [μm]. The ratio α of the growth rate of the first mode to the second mode is practically greater than 0.2 and smaller than 1.0. Accordingly, when the ratio of the growth rate measured in advance to the practical growth of the p-type current blocking layer 111 is about 1.0, the height $t_{mesa}$ of the mesa 110 is preferably greater than 2.43 μm for the p-type current blocking layer 110 with the thickness of 1.0 μm to show the current blocking function effectively.

Figure 5A:
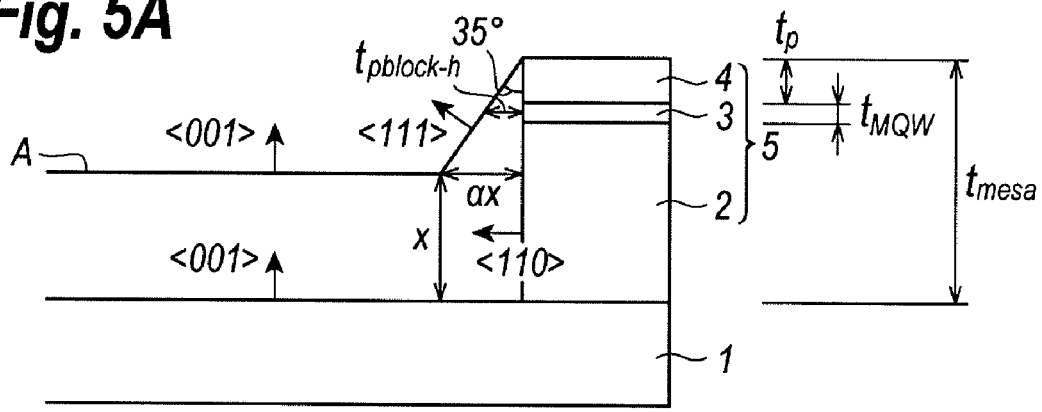
FIGS. 5A to 5C schematically illustrate the process to form the first current blocking layer, the process to form the second current blocking layer, and the process to form the second current blocking layer under a condition where the thickness of the first current blocking layer is greater than the critical thickness.
Figure 5B:
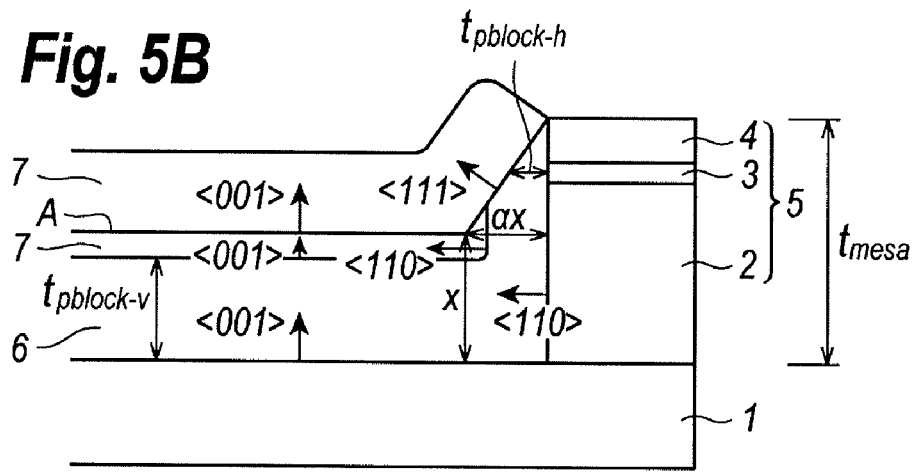
Figure 5C:
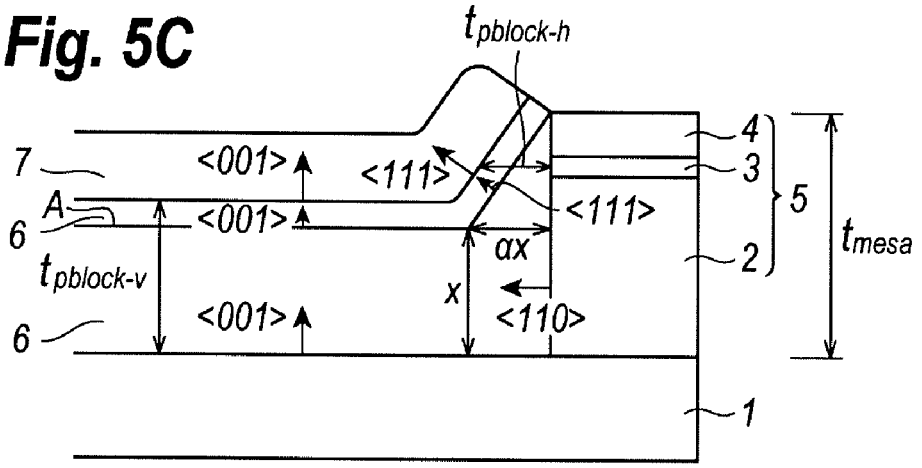
Figure 6:
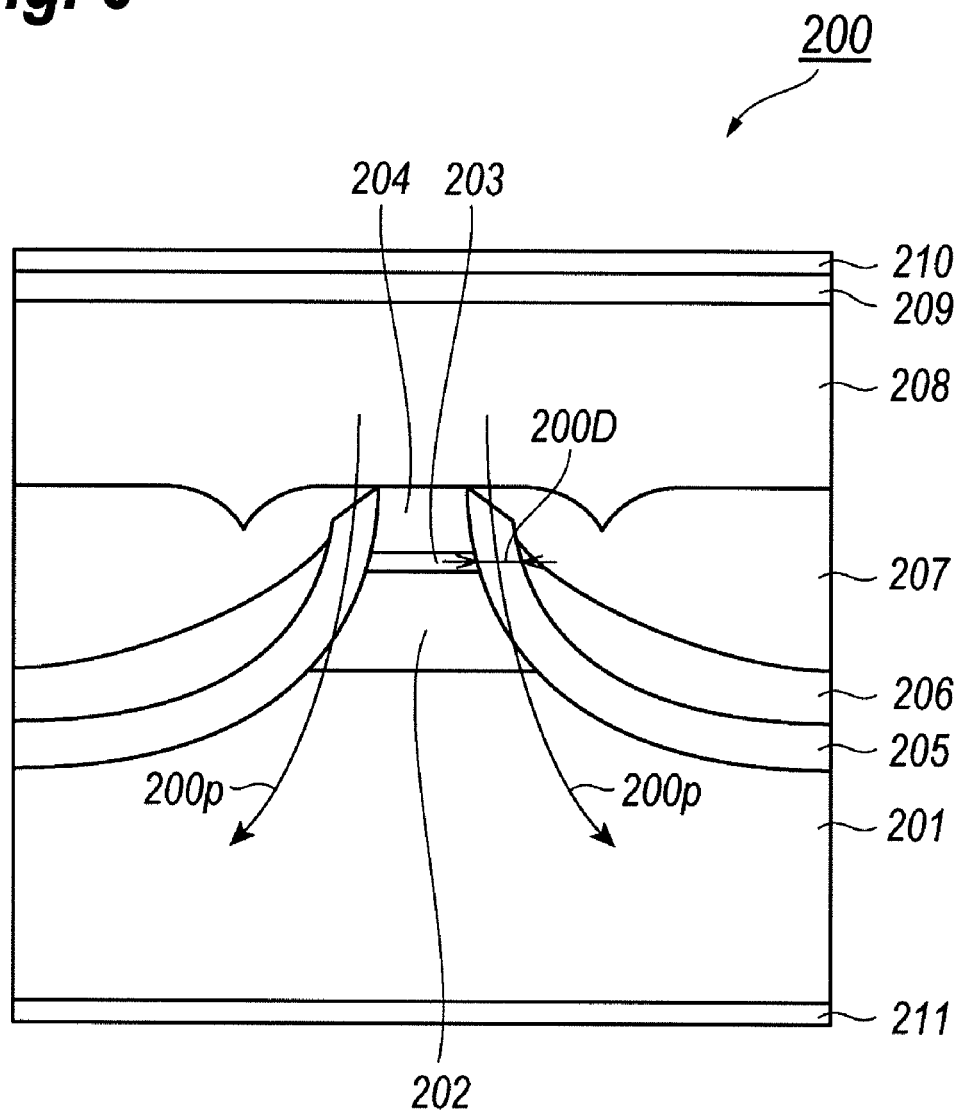
FIG. 6 is a cross section of a conventional LD with the buried mesa structure.

FIGS. 5A to 5C investigate the thickness of the layer 111 along the <110> orientation. The mesa 5 shown in FIGS. 5A to 5C correspond to the mesa 110, which includes only the n-type cladding layer 2, the active layer 3 and the p-type cladding layer 4 for the sake of the convenience. The lower cladding layer 2 is arranged between the active layer 3 and the substrate 1. Although not explicitly described, the LD shown in FIGS. 1 to 4 may have the n-type cladding in the mesa 110.

The critical level A in FIGS. 5A to 5C denotes the boundary where the growth of the second blocking layer to bury the mesa 5 changes the orientations thereof from a combination of <001> and <110> to a combination of <001> and <111>, that is, boundary where the (110) surface of the first blocking layer disappears.

Assuming the height from the substrate 1 to the level 'A' is x, the height $t_{mesa}$ of the mesa 5 becomes, from the crystallographic relations:

$$t_{mesa} = x + \alpha x \times \tan(55°) \qquad (3)$$

where α is a ratio of the growth rate along the <001> orientation to that along the <110> orientation, which is a positive number, and angle 35°, or 55°, is determined in crystallographic between the (001) surface and the (111) surface, or between the (110) surface and the (111) surface. The process according to the present embodiment preferably includes a step to estimate the ratio α by measuring the growth rate along the <110> orientation and that along the <001> orientation. Thus, a coefficient 1.43 appeared in equation (1) may be calculated from a equation x·tan(55°).

FIG. 5B shows an example where the thickness $t_{block-v}$ of the first current blocking layer 6 is thinner than the thickness x evaluated through the analysis above described. In this case, the growth of the first current blocking layer 6 advances in both orientations of <110> and <001>, and ends at a level below the critical level A. Subsequently, the second current blocking layer 7 grows along both orientations of <001> and <110> initially, but changes the orientations thereof to <001> and <111> at the critical level A. Because the first current blocking layer 6 is not substantially grown along the <111> orientation, the distance $t_{block-h}$ from the mesa 5 to the second current blocking layer 7, which corresponds to the distance d1 in previous descriptions, may be securely constant.

While, FIG. 5C shows another example where the thickness of the first current blocking layer $t_{block-v}$ exceeds the critical thickness x. In this case, the first current blocking layer 6 is first grown along the orientations of <001> and the <110>, and subsequently along the orientations of <001> and <111> after the (110) surface disappears. Then, the second current blocking layer 7 is grown on the first current blocking layer 6 but this second process for the second current blocking layer 7 grows along the orientations of <001> and <111> from the beginning thereof. Accordingly, the distance $t_{block-h}$ between the active layer 3 and the second current blocking layer 7 varies depending on the growth conditions of the first current blocking layer 6.

Thus, in order to keep the distance $t_{block-h}$ between the active layer and the second current blocking layer 7 in constant, the relation shown blow is necessary.

$$x > t_{block-v}. \quad (4)$$

That is, the condition to keep the distance $t_{block-h}$ from the active layer 3 to the second current blocking layer 7 in constant is given by the thickness $t_{block-v}$ of the first current blocking layer 6 in horizontal regions. In the same time, the height of the mesa $t_{mesa}$ is given by equation (2) above described.

From a viewpoint of the performance of the LD, the distance $t_{block-h}$ from the active layer 3 to the second current blocking layer 7 is as small as possible under a condition that the first current blocking layer 6 exists in the side of the mesa 5. According to FIG. 5, the distance $t_{block-h}$ becomes:

$$t_{block-h} = (t_p + t_{MQW}/2) \times \tan(55°), \quad (5)$$

where $t_p$ is a thickness of the p-type cladding layer 4, and $t_{MQW}$ is a thickness of the active layer 3. When the thickness $t_{MQW}$ of the active layer is 312 nm, the equation (5) becomes;

$$t_{block-h} = (t_p + 156) \times 0.70. \quad (6)$$

Thus, the thickness $t_p$ of the p-type cladding layer, the upper cladding layer or the thickness of the layers between the top of the active layer and the top of the mesa, is small as possible to shorten the horizontal distance $t_{block-h}$ from the active layer 3 to the second current blocking layer 6. The distance $(t_p + t_{MQW}/2)$ in FIG. 5A corresponds to the distance d2 appearing in FIG. 3B.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

I claim:

1. A process to form a semiconductor laser diode with a mesa structure, comprising steps of:
    growing a stack of semiconductor layers on a semiconductor substrate with a surface substantially equal to (001) orientation;
    iterating a step of dry-etching said stack and a step of ashing, said dry-etching forming said mesa structure with a side surface having a preset angle to said surface of said semiconductor substrate by using an insulating stripe extending along a <110> orientation as an etching mask, said ashing removing residues caused during said step of dry-etching;
    measuring a growth rate of a semiconductor layer along said <110> orientation and a growth rate of said semiconductor layer along said <001> orientation, wherein said semiconductor layer is made of a same material as a first current blocking layer to be subsequently grown in a next step, and determining a thickness of said first current blocking layer to be thinner than a critical thickness which is derived according to a relation of:

$$x = t_{mesa}/(1 + 1.43\alpha),$$

wherein x is said critical thickness of said first current blocking layer, $t_{mesa}$ is a height of said mesa structure and α is a ratio of said growth rate along said <110> orientation to said growth rate along said <001> orientation;
    practically growing said first current blocking layer on both sides of said mesa structure so as to bury said mesa structure; and
    growing a second current blocking layer on both sides of said mesa structure so as to bury said mesa structure,
    wherein said first current blocking layer grows along both orientations of <110> on said side surface of said mesa structure and <001> on a surface of said stack exposed by said dry-etching, and
    wherein said second current blocking layer firstly grows along both orientations of <110> and <001> on said first current blocking layer and secondly grows along both directions of <111> and <001>.

2. The method of claim 1,
    wherein said dry-etching to form said mesa structure makes an angle of a side surface of said mesa structure from 85° to 95° to said surface of said semiconductor substrate.

3. The method of claim 1,
    further comprising a step of, before said growing said first current blocking layer, treating said mesa structure with sulfuric acid and fluoric acid sequentially as leaving said insulating stripe on top of said mesa structure.

4. The method of claim 1,
    wherein said surface of said semiconductor substrate has a surface whose orientating is (001) or offset from (001) within 2°.

5. The method of claim 1,
    wherein said stack of said semiconductor layers includes an InP layer for a buffer layer, a first GaInAsP layer for an optical confinement layer, an GaInAsP layer with a multiple quantum well structure for an active layer, a second GaInAsP layer for another optical confinement layer, an InP layer for a p-type cladding layer, and an InGaAs layer for a contact layer; and wherein said process of dry-etching is carried out by using a mixture of methane and hydrogen as a reactive gas, and said process of ashing is carried out by using oxygen.

6. The method of claim 5, wherein said first cladding layer and said second cladding layer are both made of InP, and wherein said process of growing said first and second cladding layers is carried out by a metal organic vapor phase epitaxy using said insulating stripe as a selective growth mask.

7. A process to form a semiconductor laser diode with a mesa structure, comprising steps of:

growing a stack of semiconductor layers on a semiconductor substrate with a surface substantially equal to <001> orientation;

iterating a step of dry-etching said stack and a step of ashing, said dry-etching forming said mesa structure with a side surface having a preset angle to said surface of said semiconductor substrate by using an insulating stripe extending along a <110> orientation as an etching mask, said ashing removing residues caused during said step of dry-etching;

measuring a growth rate of a semiconductor layer along said <110> orientation and a growth rate of said semiconductor layer along said <001> orientation, wherein said semiconductor layer is made of a same material as a first current blocking layer to be subsequently grown in next step, and determining a thickness of said first current blocking layer to be thinner than a critical thickness which is derived according to a relation of:

$$x = t_{mesa}/(1+1.43\alpha),$$

wherein x is said critical thickness of said first current blocking layer, $t_{mesa}$ is a height of said mesa structure and $\alpha$ is a ratio of said growth rate along said <110> orientation to said growth rate along said <001> orientation, said $\alpha$ being greater than 0.2 but less than 1.0;

practically growing said first current blocking layer on both sides of said mesa structure so as to bury said mesa structure; and growing a second current blocking layer on both sides of said mesa structure so as to bury said mesa structure, wherein said first current blocking layer grows along both orientations of <110> on said side surface of said mesa structure and <001> on a surface of said stack exposed by said dry-etching, and wherein said second current blocking layer firstly grows along both orientations of <110> and <001> on said first current blocking layer and secondly grows along both directions of <111> and <001>.

8. The method of claim 7, wherein said iteration of said dry-etching and ashing forms said mesa structure with said height $t_{mesa}$ greater than 2.4 µm.

* * * * *